United States Patent [19]

Arami et al.

[11] Patent Number: 5,474,643
[45] Date of Patent: Dec. 12, 1995

[54] PLASMA PROCESSING APPARATUS

[75] Inventors: Junichi Arami, Hachioji; Tamio Endo, Kawasaki; Shiro Koyama, Fuchu; Kazuo Kikuchi, Yokohama; Teruaki Shiraishi, Koshi; Isahiro Hasegawa, Zushi; Keiji Horioka, Kawasaki; Haruo Okano, Tokyo; Katsuya Okumura, Yokohama, all of Japan

[73] Assignees: Tokyo Electron Limited, Tokyo; Kabushiki Kaisha Toshiba, Kawasaki, both of Japan

[21] Appl. No.: 169,551

[22] Filed: Dec. 20, 1993

Related U.S. Application Data

[63] Continuation of Ser. No. 732,236, Jul. 18, 1991, abandoned.

[30] Foreign Application Priority Data

Jul. 20, 1990 [JP] Japan ..................... 2-192463
Jul. 20, 1990 [JP] Japan ..................... 2-192464

[51] Int. Cl.$^6$ .................................... H05H 11/00
[52] U.S. Cl. .................................... 156/345; 216/67
[58] Field of Search .................... 156/626, 643, 156/345; 118/723 E, 712; 204/298.03, 298.32, 298.35

[56] References Cited

U.S. PATENT DOCUMENTS

| | | | |
|---|---|---|---|
| 4,329,418 | 5/1982 | Kny et al. | 118/723 IX |
| 4,433,006 | 2/1984 | Cetronio | 118/723 IX |
| 4,699,689 | 10/1987 | Bersin | 156/345 X |
| 4,812,416 | 3/1989 | Hewig et al. | 156/626 X |
| 4,816,098 | 3/1989 | Davis et al. | 156/345 |
| 4,842,683 | 6/1989 | Cheng et al. | 156/345 |
| 4,878,995 | 11/1989 | Arikado et al. | 156/345 X |
| 4,949,670 | 8/1990 | Krogh | 156/345 X |
| 4,963,242 | 10/1990 | Sato et al. | 156/345 X |
| 4,994,140 | 2/1991 | Kenzo et al. | 156/345 X |
| 5,135,608 | 8/1992 | Okutani | 156/345 X |

Primary Examiner—Thi Dang
Attorney, Agent, or Firm—Oblon, Spivak, McClelland, Maier & Neustadt

[57] ABSTRACT

A plasma processing apparatus has a process chamber for receiving an article to be processed, a monitoring window forming part of the peripheral wall of the process chamber, a pressure leading-out port, gates, and a plasma generating device for forming an electric field and generating plasma in the process chamber. The process chamber is defined by the peripheral wall having a circular cross section. Members forming parts of the peripheral wall each have an inner face continuous with the surface of the peripheral wall and curved substantially at the same radius of curvature as the surface of the peripheral wall.

6 Claims, 13 Drawing Sheets

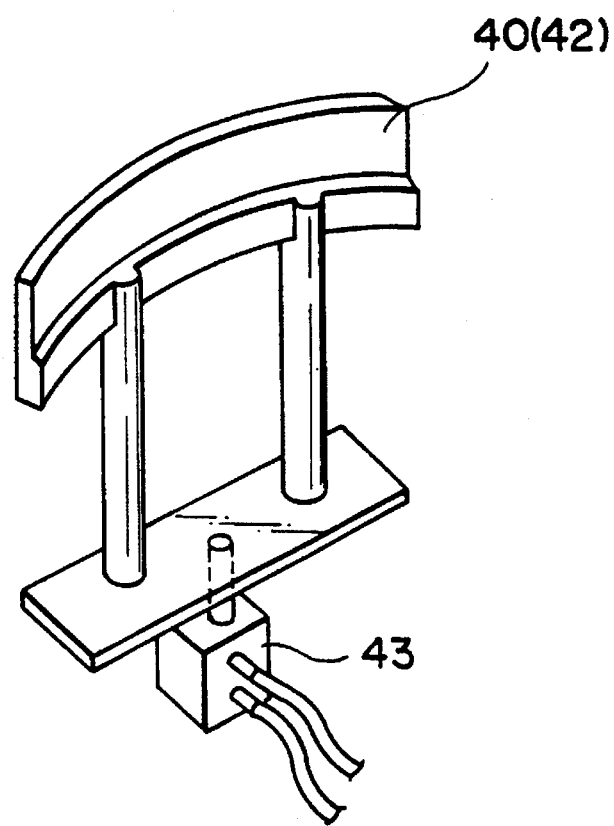
F I G. 2A
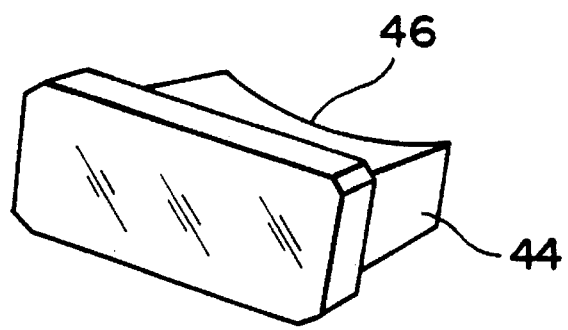
F I G. 2B

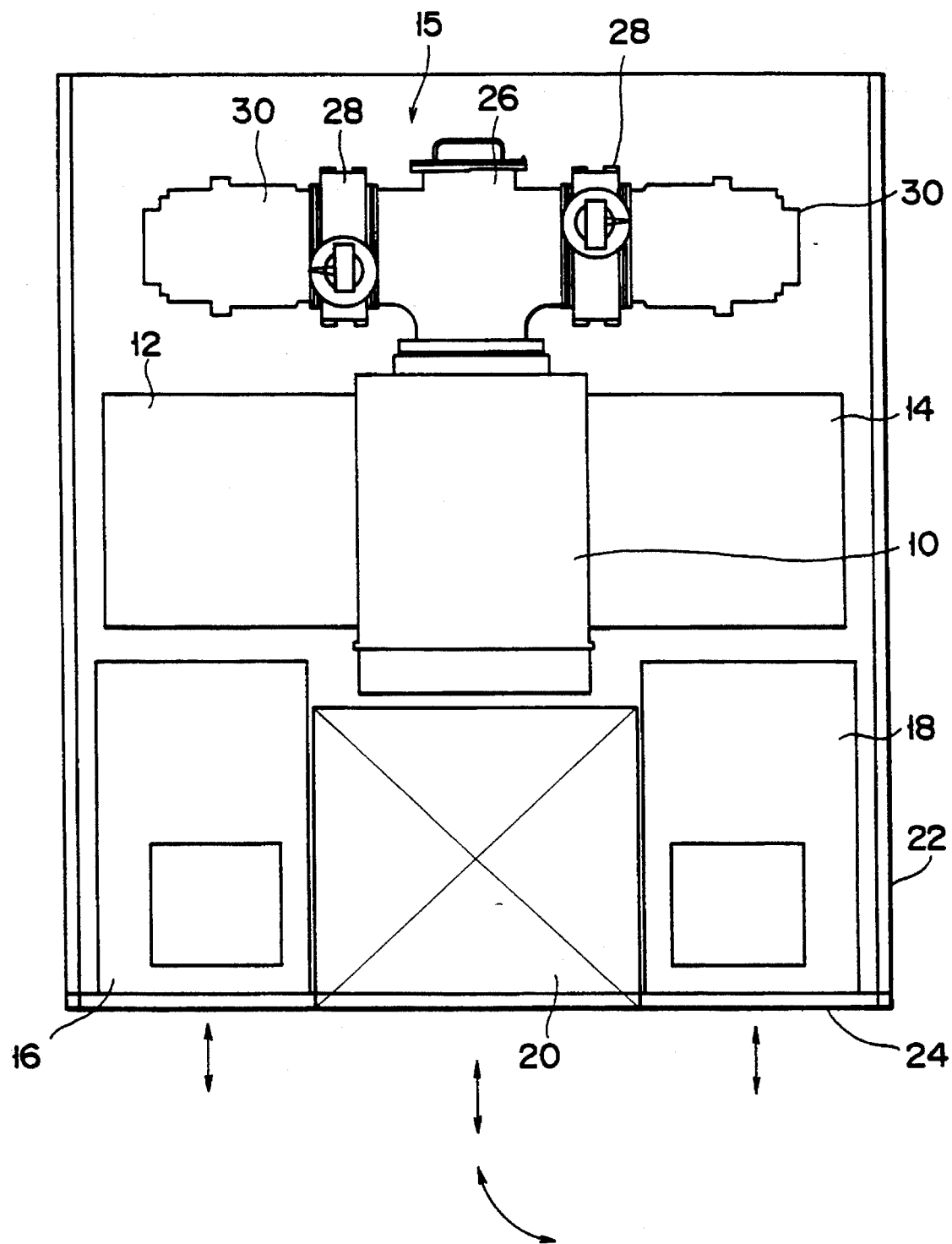
F I G. 3

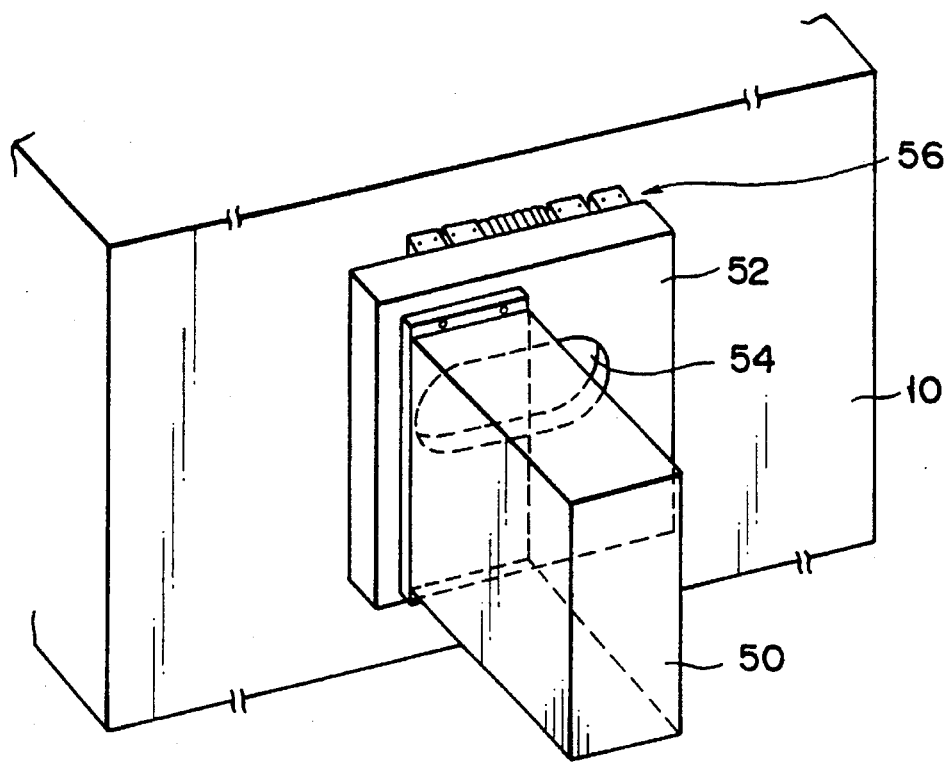
F I G. 4A
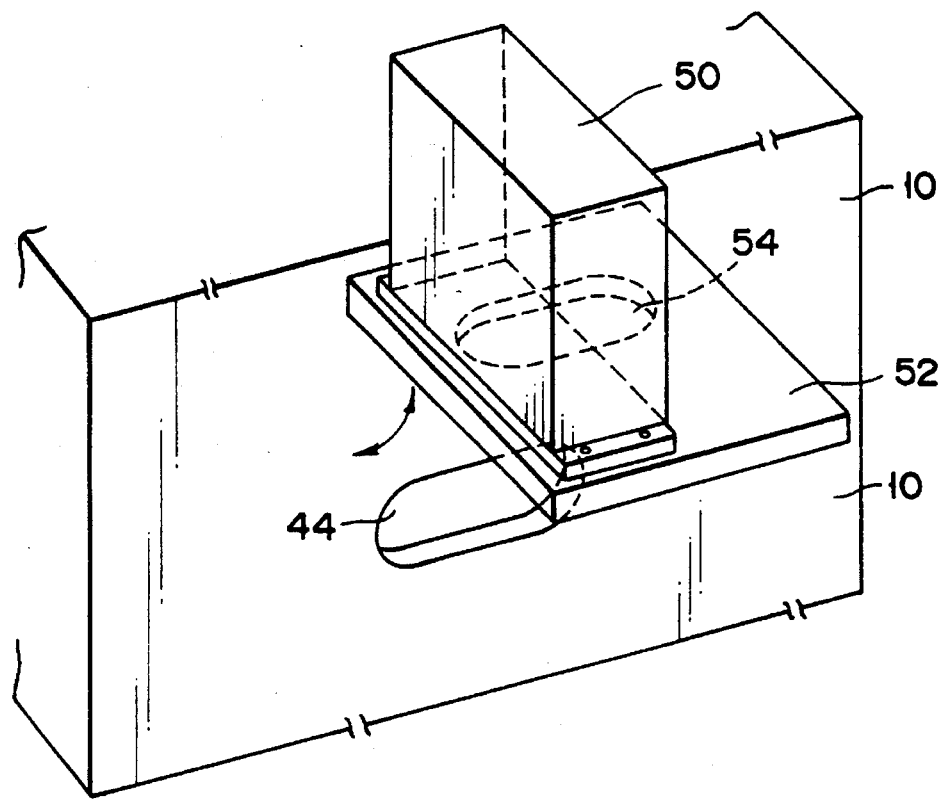
F I G. 4B

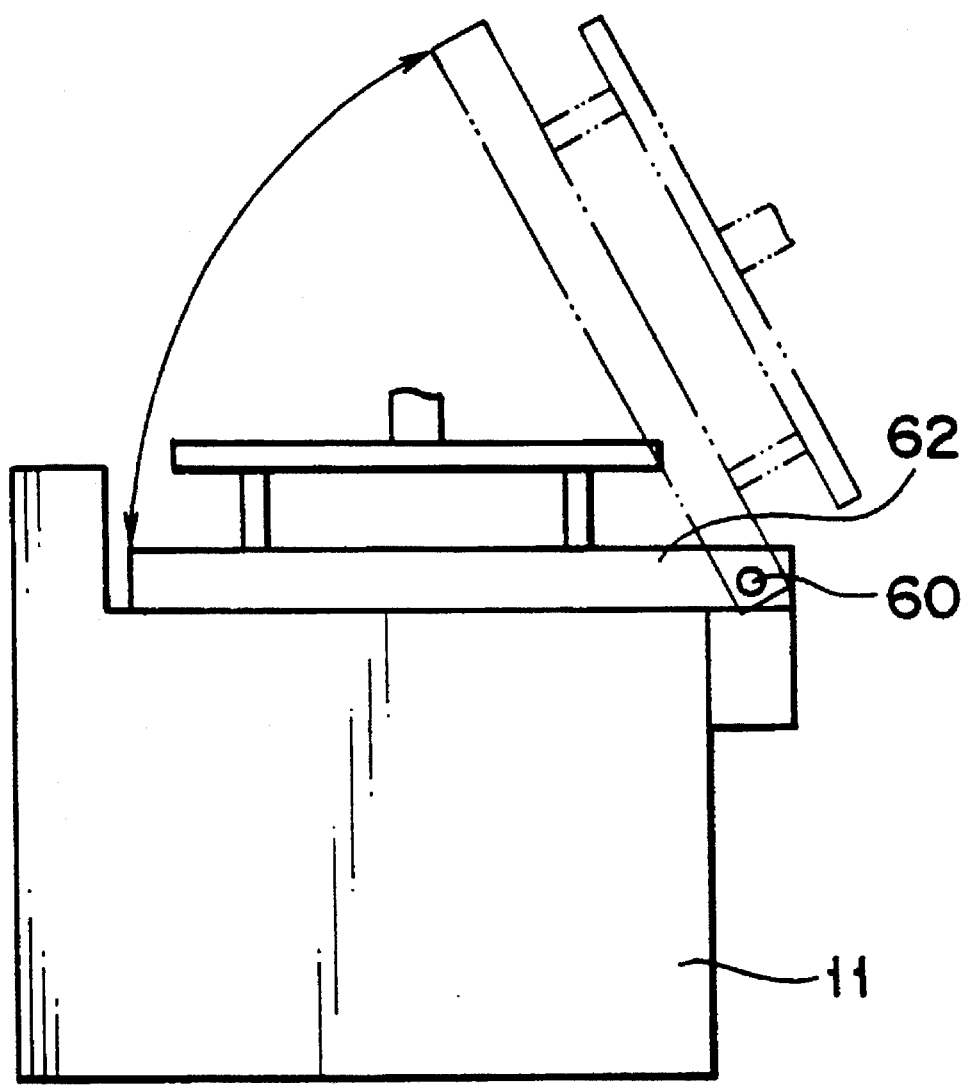
F I G. 5

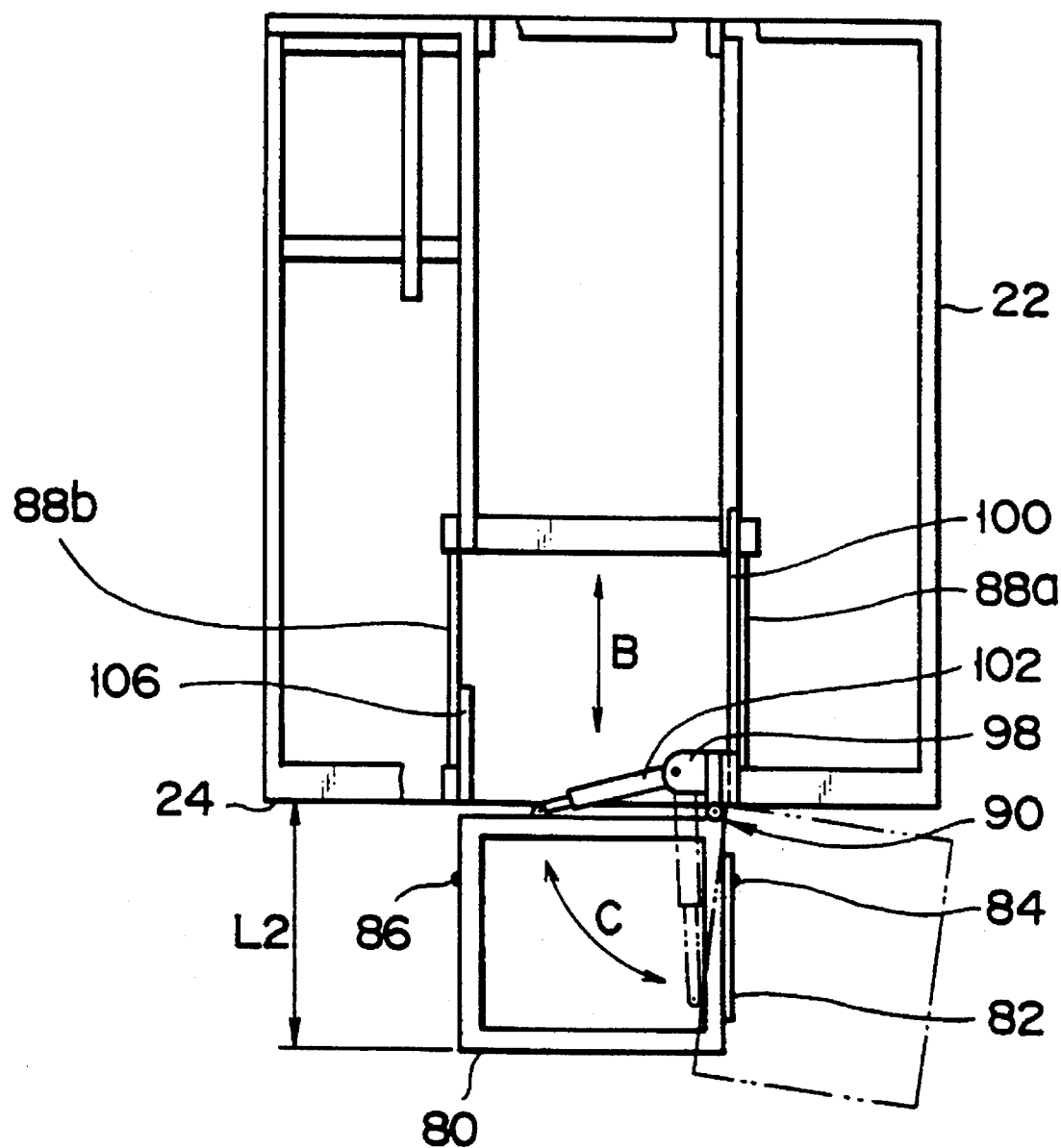
F I G. 7

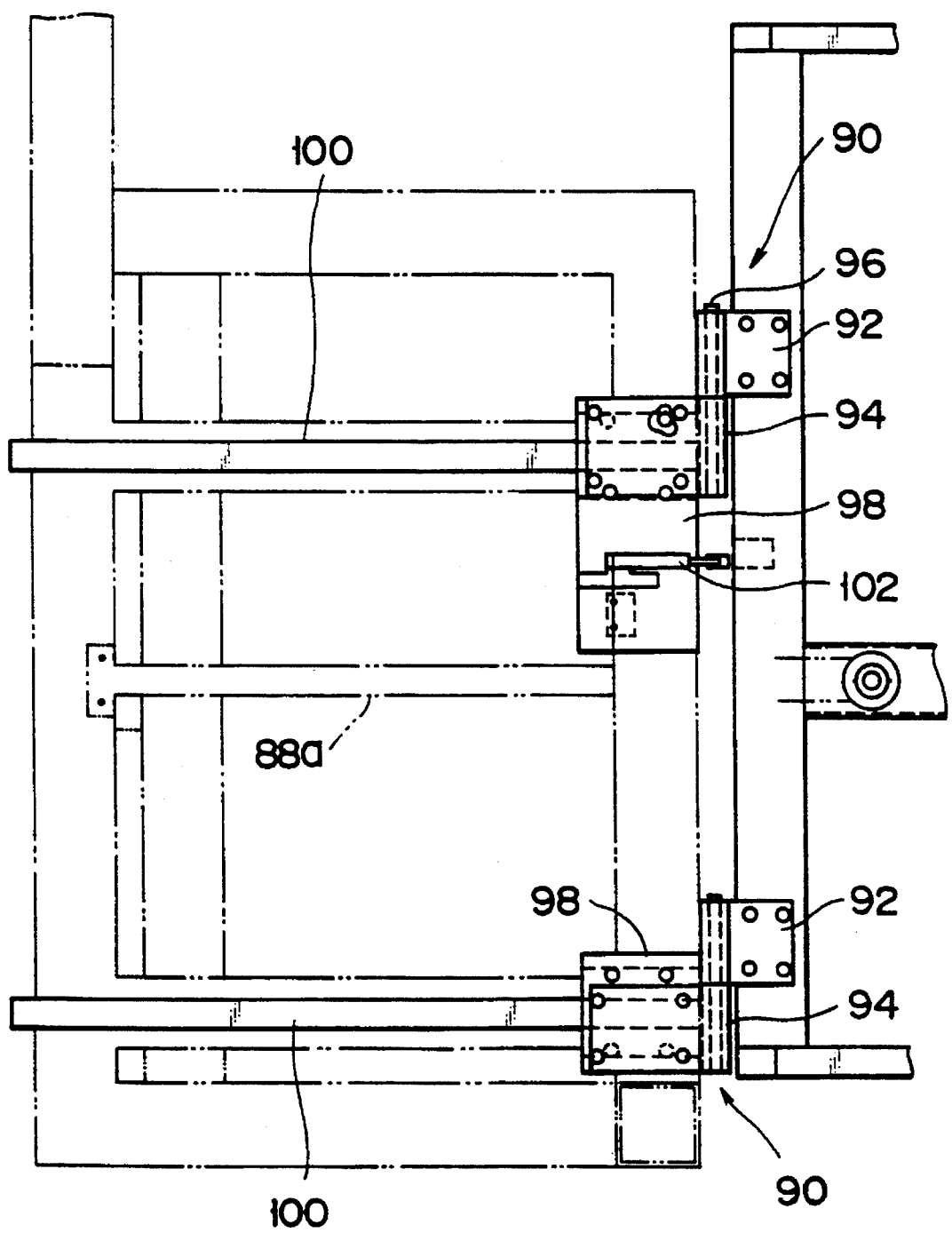
F I G. 9

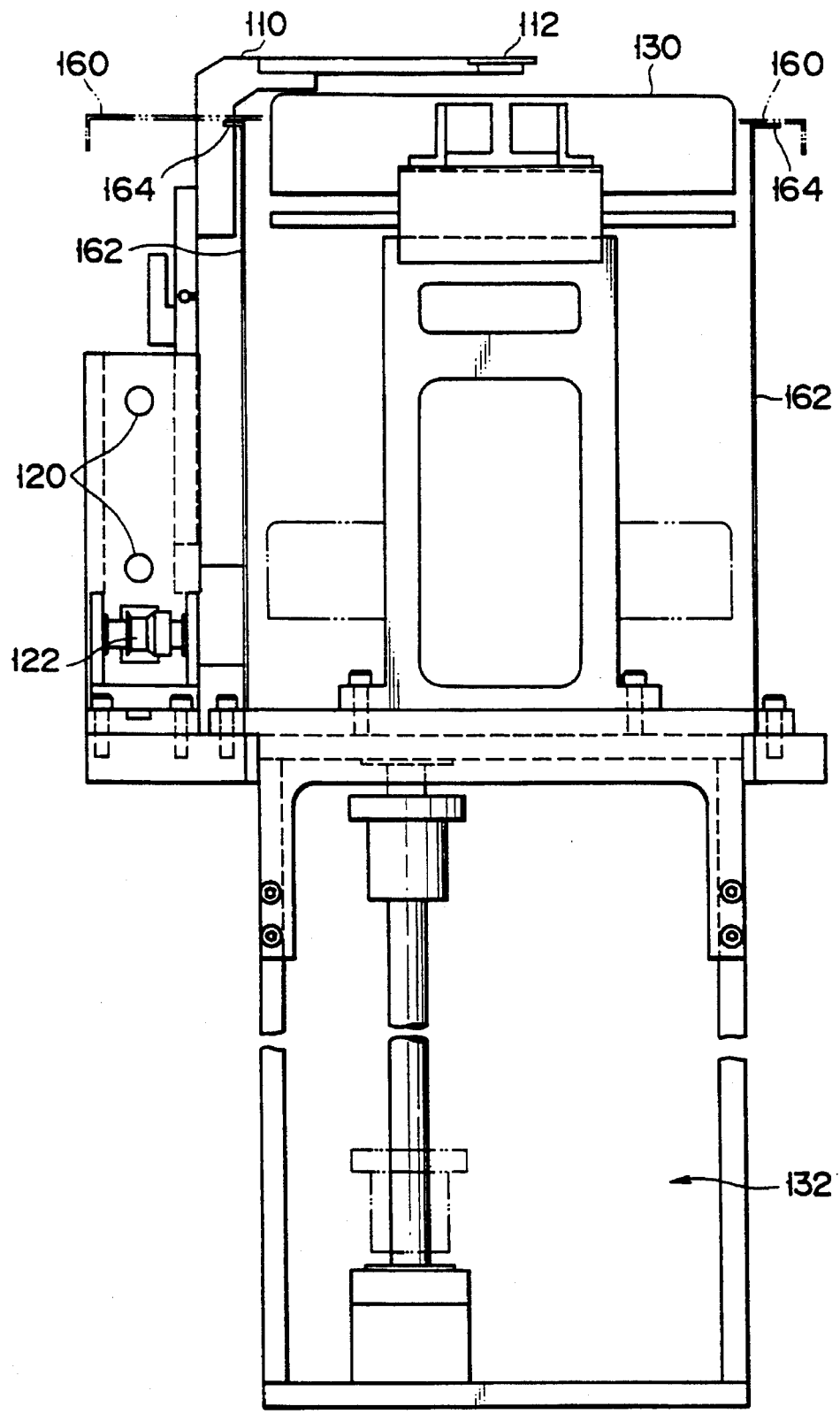
F I G. 12

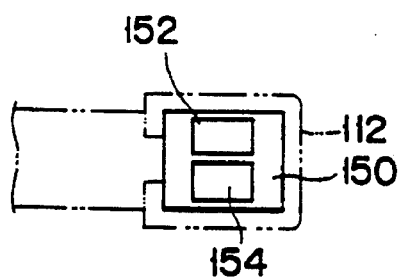
F I G. 13A
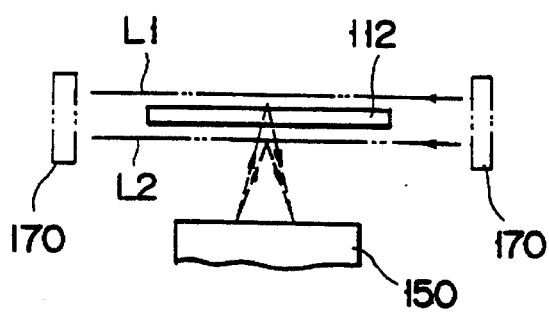
F I G. 13B
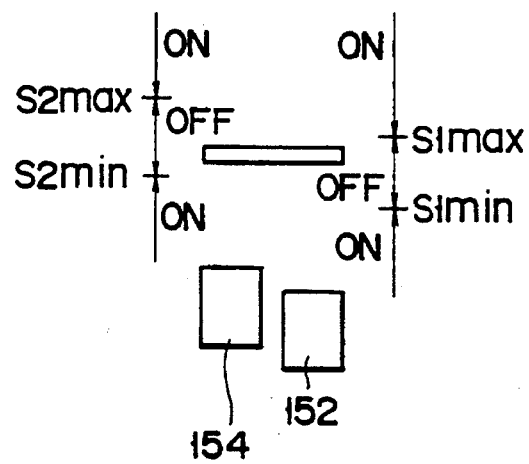
F I G. 13C
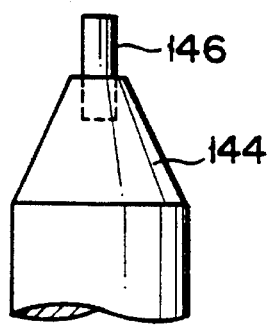
F I G. 14

PLASMA PROCESSING APPARATUS

This application is a continuation of application Ser. No. 07/732,236, filed on Jul. 18, 1991, now abandoned.

BACKGROUND OF THE INVENTION

1. Field of the Invention

This invention relates to a plasma etching apparatus, and more particularly to a plasma processing apparatus such as a plasma CVD apparatus.

2. Description of the Related Art

There has been known a magnetron plasma etching apparatuses in which a pair of electrodes are arranged in an opposed relationship in a process chamber, an article to be processed is loaded on one of the opposed electrodes, plasma is generated between the opposed electrodes by means of high frequency current, a magnetic field which is perpendicular to an electric field is formed in parallel with the article to be processed and etching is performed on the article.

In this kind of magnetron plasma etching apparatus, it is necessary to generate a magnetic field in a range larger than the surface area of an article to be processed such that a uniform magnetic field is formed in parallel with articles to be processed. In consequence, needless discharge is likely to occur at the corner portions which form recesses when the process chamber assumes a parallelepiped form.

The state of the plasma in the process chamber must be externally monitored in the magnetron plasma etching apparatus. In doing so, a notch is formed in the inner wall of the process chamber and is covered with a transparent member to be used as a plasma monitoring window. The notch forms a depression and thus produces needless discharge.

Further, depressions are also formed by gates for opening and closing transportation paths, opened to the process chamber, for transporting an article to be processed into or out of the process chamber. This structure creates needless discharge.

These problems arise not only in the magnetron plasma etching apparatuses but also in other plasma etching apparatuses in which no magnetic field is generated.

SUMMARY OF THE INVENTION

The object of this invention is to provide a plasma processing apparatus which suppresses the generation of needless discharge in a process chamber.

This object is achieved by a plasma processing apparatus comprising a process chamber for receiving an article to be processed, the process chamber having a peripheral wall including a portion and the other portion and formed circularly in cross section, means for constituting part of the peripheral wall having substantially at the same radius of curvature as the inner surface of the other portion of the process chamber, and plasma generating means for forming an electric field in the process chamber so as to generate plasma.

In this invention, the peripheral wall has a circular cross section, and a plasma monitoring window which is a member, such as a transparent member, provided in the peripheral wall and/or gates are formed continuously with the inner surface of the peripheral wall surface substantially at the same radius of curvature as the other portion of the peripheral wall. This arrangement prevents the formation of depressions formed by the plasma monitoring window and the gates in the process chamber and ensures that excess plasma is prevented from being generated.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 2A is a perspective view of a gate shown in FIG. 1;

FIG. 2B is a plasma monitoring window shown in FIG. 1;

FIG. 3 is a plan view of a plasma processing apparatus of this embodiment;

FIG. 4A and 4B are perspective views of wafer detecting devices provided outside of the plasma monitoring window;

FIG. 5 is a front view of the opening/closing mechanism of an upper cover provided on a process chamber;

FIGS. 7 and 8 respectively show a plan view and a front view of drawing, transporting and rotating mechanisms;

FIG. 9 is a partial view of a hinge portion as seen in the directions shown by arrows A—A in FIG. 8;

FIGS. 10, 11 and 12 are a front view, a plan view and a right side view of a sender of the plasma processing apparatus according to this invention;

FIGS. 13A to 13C illustrate sensors for detecting deformation of transportation arm provided on the sender; and FIG. 14 is a side view of the tip portion of a lifter pin provided on the sender.

DETAILED DESCRIPTION OF THE PREFERRED EMBODIMENTS

Figure 1:
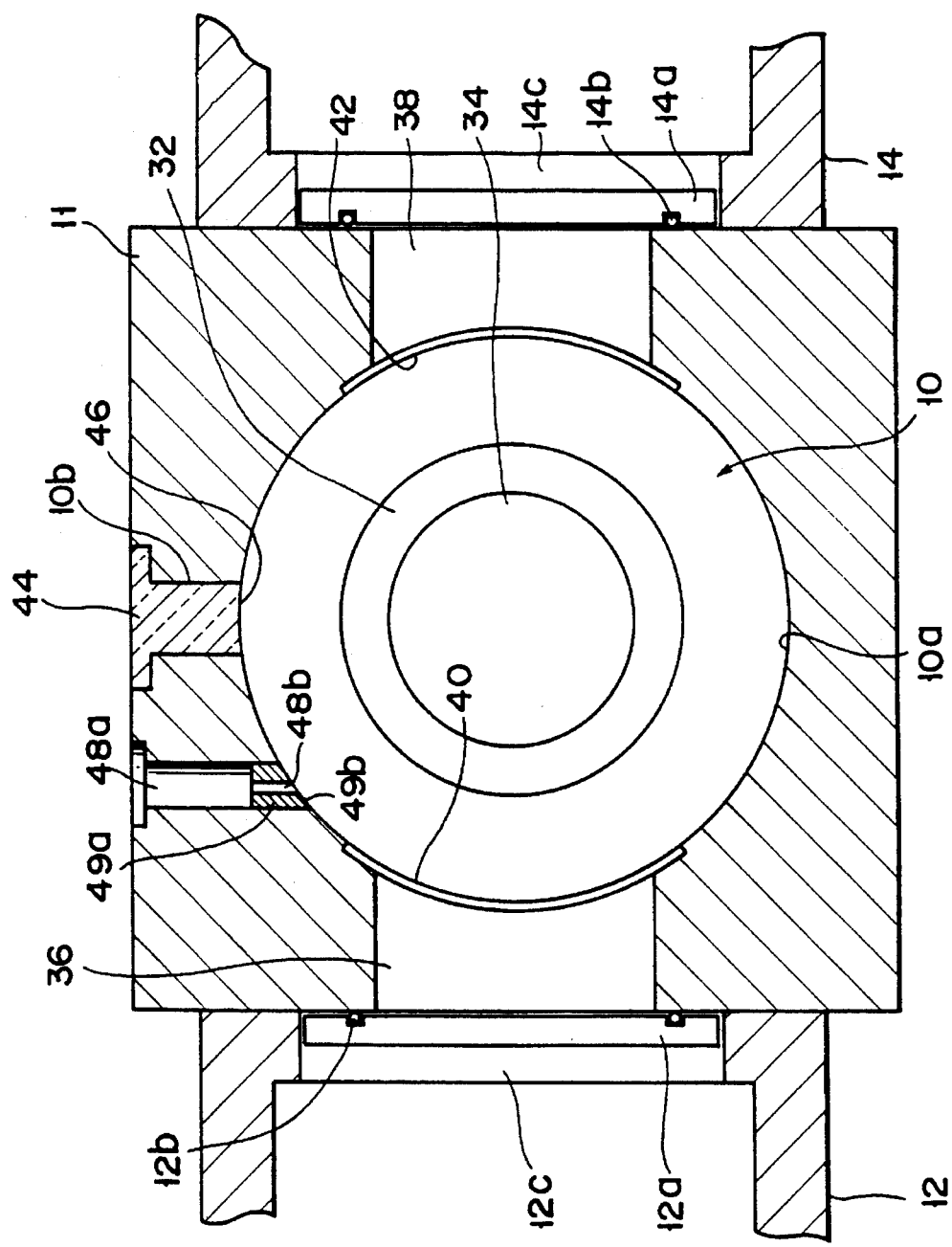
FIG. 1 is a cross-sectional view of an embodiment of a plasma processing apparatus according to this invention.

This invention will now be explained in connection with preferred embodiments with reference to the accompanying drawings.

A magnetron plasma etching apparatus will now be outlined with reference to FIG. 3. A first load lock chamber 12 for receiving a wafer and a second load lock chamber 14 for taking the wafer out are connected to the respective ones of both sides of a process chamber 10 in which magnetron etching is performed. Air can be evacuated from the chambers 10, 12 and 14 by means of a vacuum pump 15. A sender 16 and a receiver 18 are disposed opposed to the load lock chambers 12 and 14, respectively, in the normal pressure atmosphere. A wafer is taken out of a cassette (not shown) at the sender 16 and is pre-aligned. Then, the wafer is delivered through the load lock chamber 12 into the process chamber 10 by means of a transportation arm (not shown in FIG. 3) provided in the first load lock chamber 12. The receiver 18 supports the cassette and receives the processed or etched wafer through the load chamber 14.

Mounted between the sender 16 and the receiver 18 is a control box 20 in which are provided a control circuit for controlling the plasma etching apparatus and an electric power source.

The chambers, the sender, the receiver and the control box are supported by a main body frame 22. The sender 16 and the receiver 18 are adapted to be pulled out from the front face 24 of the main body frame 22 in the direction of arrow as shown in FIG. 3. After being pulled out from the front face 24, the control box 20 rotates toward the front portion of the receiver 18. The drawing mechanism will be explained later.

An exhaust pipe 26 is connected to the process chamber 10. The pipe 26 is branched into two portions which are connected to two turbo pumps 30 through gate valves 28. The use of two turbo pumps 30 provides enhanced maintenance and large conductance.

The process chamber 10 will now be explained in detail with reference to FIG. 1.

A main chamber body 11 containing the process chamber 10 is made of alumite ($Al_2O_3$) and formed with a peripheral wall of circular cross section. In the process chamber 10 is disposed a susceptor 32 on which an electrostatic chuck 34 is mounted. A high voltage is impressed on the chuck 34 and exerts a coulomb force on a wafer (not shown) such that the chuck 34 electrostatically attracts the wafer. In this embodiment, one electrode of the electrostatic chuck is embedded in an insulation member. When plasma is generated between the electrodes, a wafer is electrostatically chucked by means of a coulomb force. The susceptor 32 and the upper wall (not shown) of the process chamber 10 constitute opposed electrodes. When, for example, the RIE plasma etching is to be performed, RF power is supplied to the susceptor 32 and the main chamber body 11 is grounded so as to generate plasma between the opposed electrodes. A horizontal magnetic field is produced on the surface of the wafer. For example, over the upper wall (not shown) of the process chamber 10 is provided a magnet (not shown). The magnet may be eccentrically rotated with respect to the susceptor 32 such that a horizontal magnetic field is produced in parallel with the wafer fixed onto the electrostatic chuck 34.

Formed in the process chamber 10 are a sending-in passage 36 and a sending-out passage 38. The sending-in passage 36 is formed so as to be opposed to the gate inlet 12 of the first load chamber 12 and a sending-out passage 38 is formed so as to be opposed to the gate outlet 14c of the second load chuck 14. The passages 36 and 38 are opened at the peripheral wall 10a to the process chamber 10 and are provided with gates 40 and 42 for opening/closing the respective passages 36 and 38. As shown in FIG. 2A, the gates 40 and 42 are curved at the same or substantially the same radius curvature as those of the peripheral wall 10a of the process chamber 10 and are moved vertically by means of an air cylinder 43 so as to selectively open and close the passages 36 and 38. It is preferable that the gates 40 and 42 are made of electrically conductive material such as ferrite such that they are electrically conductive even in the range of high frequencies and that the inner surfaces of the gate 40 and 42 are coated with alumina ($Al_2O_3$) by surface treatment.

The gates 12a and 14a for selectively opening and closing the gate inlet 12c and the gate outlet 14c of the load lock chamber 12 and 14 have O-rings 12b and 14b for effecting sealing between the gates 12a and 14a and the process chamber 10. In this connection, it is not always necessary for the gates 40 and 42 arranged in the process chamber 10 to be provided with hermetical seals.

In the process chamber 10 is provided a plasma monitoring window 44 for observing the state of plasma in the process chamber 10, the window 44 being formed by placing transparent material such as quartz in a depression or hole 10b which extends from the peripheral wall 10a to the outer wall surface of the process chamber 10. As shown in FIG. 2B, the plasma monitoring window 44 has an inner surface 46 which faces the process chamber 10 and formed continuously with the peripheral wall 10a and curved at the same or substantially the same as the peripheral surface 10a.

In FIG. 1, a pressure detecting port 48a is opened at the peripheral wall 10a to the process chamber 10. In this embodiment, a port member 49a having a port hole or opening 48b (5 mm to 10 mm in diameter) and made of quartz, aluminum or the like is inserted in the pressure detecting port 48a in such a manner that the inner face 49b faces the peripheral wall 10a. It is understood that this arrangement prevents the formation of a depression which would create needless discharge. As stated above, the inner face 49b facing the process chamber 10 is continuous with the peripheral wall 10a at substantially the same radius of curvature as the spherical surface 10a.

There will be explained the plasma etching apparatus according to the embodiment of this invention.

In the state where the sending-out side gates 42 and 14a are closed and the sending-out side gates 40 and 12a are opened, a wafer is transmitted into the process chamber 10 by means of the transportation arm provided in the first load lock chamber 12. The sent-in wafer is received by a push pin (not shown) projecting above the electrostatic chuck 34 and loaded thereon by lowering the pusher pin. After the sending-in side gates 40 and 12a have been closed, air is evacuated to a predetermined degree of vacuum from the process chamber 10. Then, an etching gas is introduced into the process chamber 10, RF power is supplied to the opposed electrodes in order to generate plasma and the magnet is eccentrically rotated thereby to form a horizontal magnetic field. The wafer is grounded through the plasma and a high voltage is applied to the electrostatic chuck 34 such that the wafer is attracted by a coulomb force. In this way, the process of plasma-etching wafer is initiated.

The horizontal magnetic field must be produced by the magnet in a very wide range in order to make the magnetic field parallel with the wafer. In doing so, plasma is moved on the peripheral wall 10a of the process chamber 10 in such a manner that the plasma laps the peripheral wall 10a. If there is any depression in the peripheral wall 10a, needless discharge is produced thereat. The circular configuration of the cross section of the peripheral wall 10a of this embodiment according to this invention can reduce the generation of excess plasma by such an amount corresponding to the depressions (that is, corners) formed in that peripheral wall of the conventional process chamber which has a rectangular cross section.

The sending-in passage 36 and the sending-out passage 38 connected to the peripheral wall 10a also form depressions. When, however, plasma is generated in the process chamber 10, they are closed by the gates 40 and 42. Since the inner surfaces of the gates 40 and 42 are formed continuously with the peripheral wall 10a and curved substantially at the same radius of curvature as the wall 10a, the formation of needless discharge can be prevented. In particular, when the gates 40 and 42 are made of ferrite or the like, the magnetically sealing effect resulting from the material reduces the magnetic fields produced in the sending-in passage 36 and the sending-out passage 38, suppressing the formation of the plasma in the passages 36 and 38.

Further, the inner surface 46 of the plasma monitoring window 44 is formed continuously with the peripheral wall 10*a* of the process chamber 10 substantially at the same radius of curvature as the wall 10*a*, thereby effectively preventing the generation of needless discharge. That port hole 48*b* of the pressure detecting port 48*a* which is opened to the process chamber 10 is relatively small, and that inner surface 49*b* of the port member 49*a* which faces the process member 10 is continuous with the peripheral wall 10*a* and curved at the same radius of curvature as the wall 10*a* such that the peripheral wall 10*a* and the inner surface 49*b* of the port member 49*a* form a continuous, curved face. This structure prevents needless discharge from being generated.

When the process chamber 10 is constructed as described above, the gates 40 and 42 and plasma monitoring window 44 may be made of various kind of other material, and various modifications are applicable to its driving system. Particularly, in order to open and close the gates 40 and 42 in the process chamber 10, it is preferred that they are operated in a non-contacting state with the peripheral wall 10*a* of the chamber 10 after they have been separated from the wall 10*a*.

As shown in FIGS. 4A and 4B, an end point detector (EPD) is provided on the outer wall surface of the plasma monitoring window 44. An EPD box 50 is fixed to a fixing plate 52 formed with a detecting window 54 disposed so as to face the plasma monitoring window 44. The fixing plate 52 is hinged to the outer wall of the process chamber 10 and is swingably supported thereon. When end point detecting is performed, the fixing plate 52 is closely contacted with the outer wall of the process chamber 10 as shown in FIG. 4A, and the state of plasma in the process chamber 10 is observed through the detecting window 54 and the plasma monitoring window 44 by means of a sensor provided in the EPD box 50.

When the end point detecting is unnecessary, the fixing plate 52 is rotated about the hinge 56 so as to be lifted as shown in FIG. 4B, and this enables plasma in the process chamber 10 to be observed directly. The fixing plate 52 is held by means of a lock mechanism (not shown) at a position at which it is lifted as shown in FIG. 4B.

Various mechanisms for improving the maintenance of the plasma etching apparatus will now be explained with reference to FIGS. 5 to 9.

FIG. 5 shows a mechanism for improving the maintenance of the process chamber 10. On one end of the chamber body 11 is provided a pivotal shaft 60 on which the upper cover 62 is rotatably supported. In order to effect maintenance of the process chamber 10, the chamber 10 can be easily opened by rotating the upper cover 62 about the pivotal shaft 60. When the upper cover 62 is closed, hermetically sealing means is required between the upper cover 62 and the process chamber 10.

Mechanisms for drawing the sender 16 and the receiver 18 from the main body front face 24 of the 10 main body frame 22 will now be explained with reference to FIG. 6.

Figure 6:
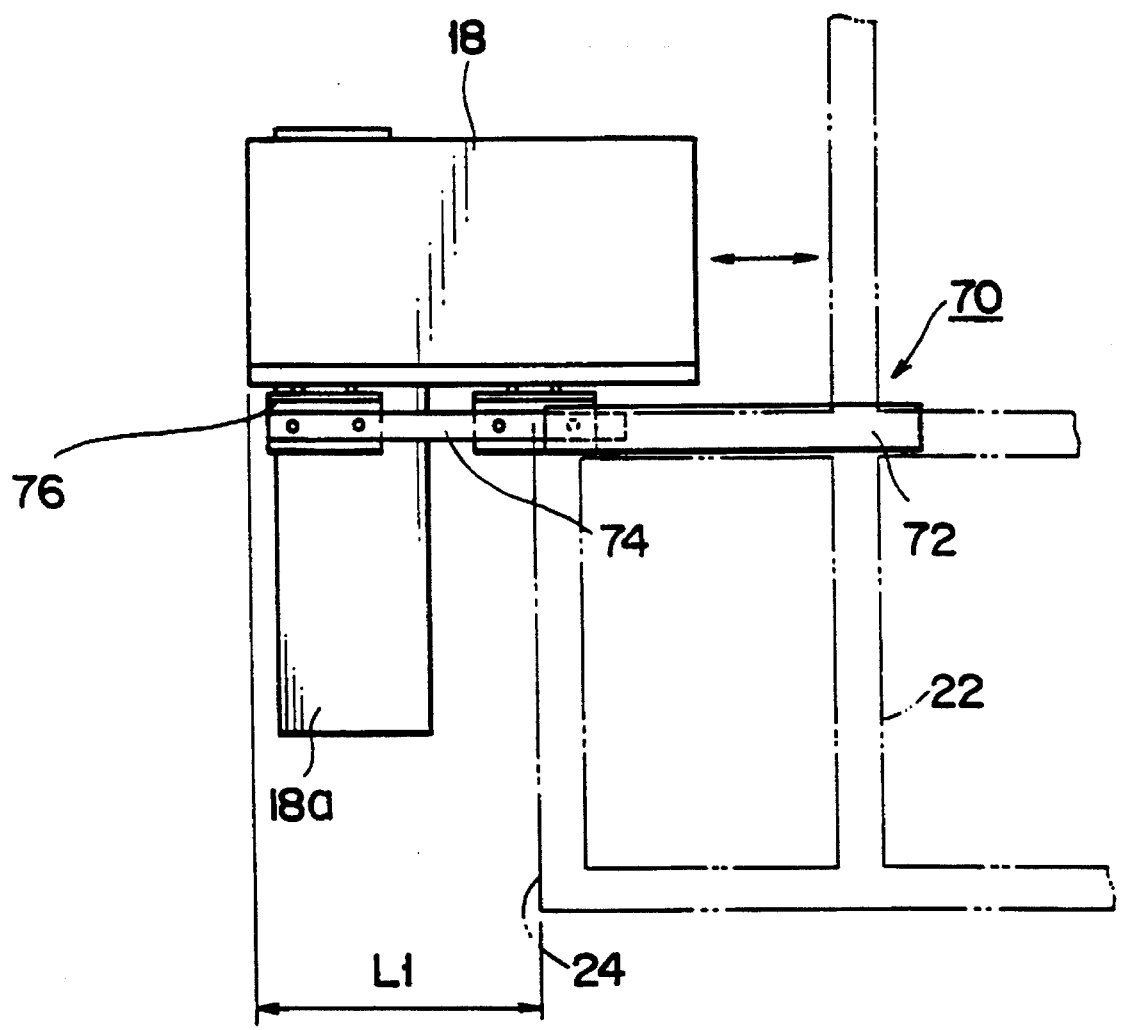
FIG. 6 is a schematic view of the drawing mechanism of a receiver according to this invention.

FIG. 6 shows a right side view of a mechanism for drawing the receiver 18 which is part of the plasma processing apparatus, as shown in FIG. 3. The mechanism for drawing the sender 16 has the same structure as the mechanism for drawing the receiver 18. Slide rail assemblies 70 are provided on the lower portions of both sides of the receiver 18 (one of them being shown in FIG. 6). Each rail assembly 70 comprises an outer rail 72 fixed to the main body frame 22 and an inner rail 74 movably supported on the outer rail 72. Fixing plates 76 are fixed to two separated portions of the inner rail 74 and to the lower end portion of the receiver 18.

Upon drawing the receiver 18, the inner rail 74 fixed by means of the fixing plate 76 to the receiver 18 is moved along the outer rail 72 from the main body front face 24 toward the operator by a distance L1. This structure improves the maintenance of not only the receiver 18 but also the rear side load lock chamber 14. Since the mechanism for drawing the sender 16 is the same as the mechanism for drawing the receiver 18, the maintenance of the sender 16 and the load lock chamber 12 is also enhanced.

Figure 8:
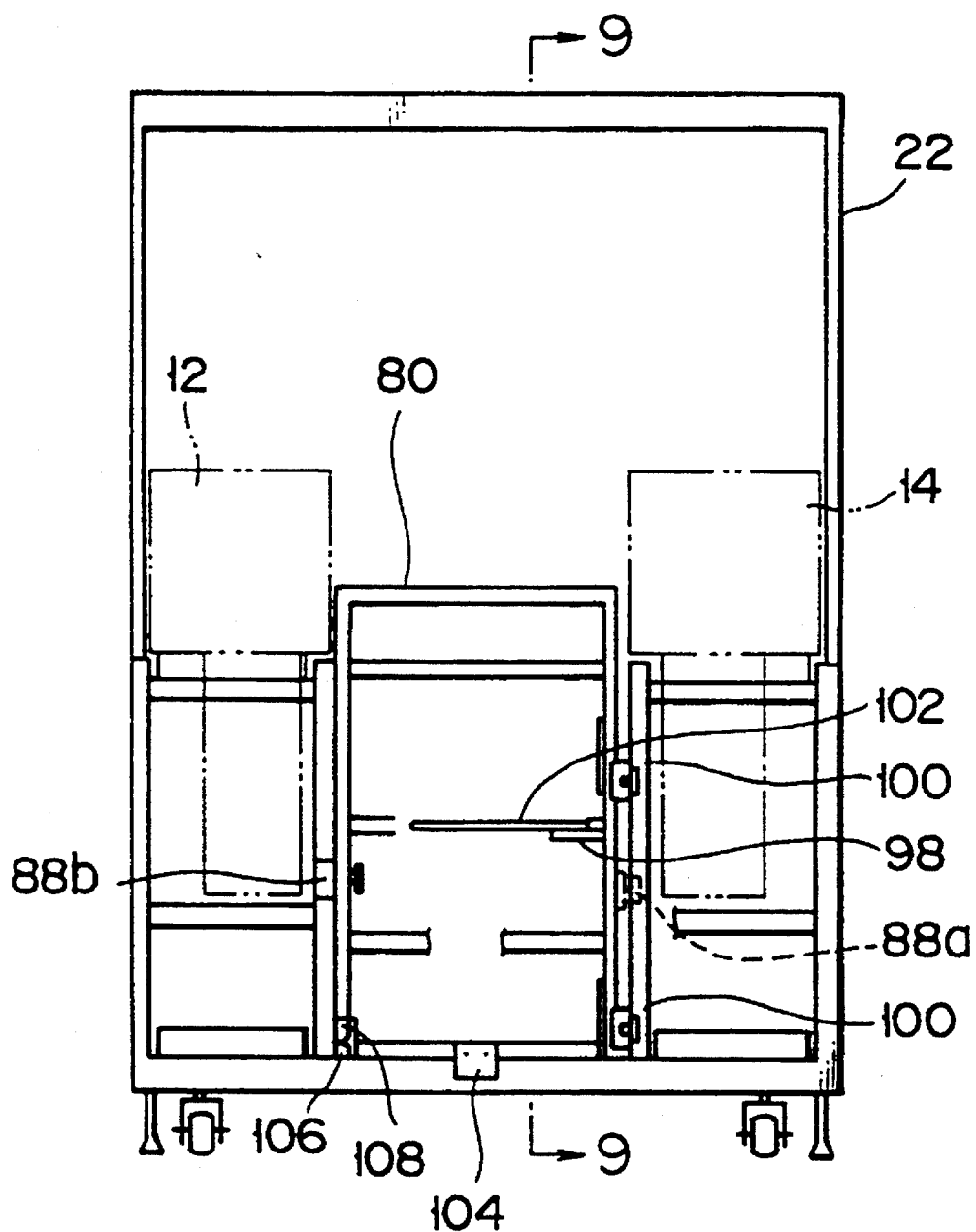

A mechanism for drawing the control box 20 will now be explained with reference to FIGS. 7 to 9.

A caster 84 is provided by means of a caster bracket 82 on the right side of a controller frame 80 on which the control box 20 is mounted and another caster 86 is provided on the left side of the controller frame 80 substantially at the same level as the caster 84. The casters 84 and 86 are guided by a right side rail 88*a* and a left side rail 88*b* so as to be movable therealong. The controller frame 80 can be drawn in the directions shown by an arrow B in FIG. 7.

As shown in FIG. 7 again, the controller frame 80 can be rotated in the directions shown by an arrow C. The drawing and the rotation allows the operator to have an access to the just front portion of the process chamber 10 disposed at the central portion of the plasma processing apparatus and thus the maintenance of the mechanism for drawing the control box 20 is improved.

A hinge 90 will now be explained with reference to FIG. 9 which is taken along the line A—A in FIG. 8. The hinge 90 comprises an upper step portion and a lower step portion separated vertically from each other along the controller frame 80. Each step portion of the hinge 90 comprises a first hinge piece 92 extending toward the controller frame 80 and a second hinge piece 94 extending toward the main body frame 22 and pivotally connected to the first hinge piece 94 by means of a pin 96. The second hinge piece 94 is screwed to a hinge bracket 98 which is movable along an LM guide 100 immovably provided at the side of the main body frame 22. On the upper step portion is provided a telescopic arm 102 having one end thereof pivoted to the hinge bracket 98 and the other end rotatably supported at the rear face of the controller frame 80. The telescopic movement of the arm 102 can rotate the controller frame 80 in the directions of the arrow C in FIG. 7.

A metallic fixture 104 is fixed to the lower end of the front face of the controller frame 80 so as to project downward therefrom. When the controller frame 80 is set to an operating position, the metallic fixture 104 abuts against the front face 24 and acts as a stop. A rail 106 and a caster 108 are provided at the lower portion of the left side of the controller frame 80 and are arranged such that they make rolling contact with each other. This arrangement permits the controller frame 80 to run smoothly at the left side thereof.

The controller frame 80 on which the controller box 20 is mounted can be pulled out from the main body front face 24 in the direction B in FIG. 7 by a distance L2. In this state, the controller frame 80 is rotated about the hinge 90 in the direction C in FIG. 7 so as to move the control box 20 to the front portion of the receiver 18. In consequence, an ample space for admitting an operator is maintained between the sender 16 and the receiver 18, thereby enhancing maintenance of parts and members in the vicinity of the space.

The mechanisms as shown in FIGS. 6 to 9 are applied not only to plasma etching apparatuses but also to other apparatuses which require these kinds of units.

An arm type transportation device provided in the sender of the plasma etching apparatus will now be explained.

In this apparatus, a wafer to be processed is transported from the sender 16 into the process chamber 10 through the first load lock chamber 12 and the processed wafer is sent out onto the receiver 18 through the second load lock chamber 14.

Figure 10:
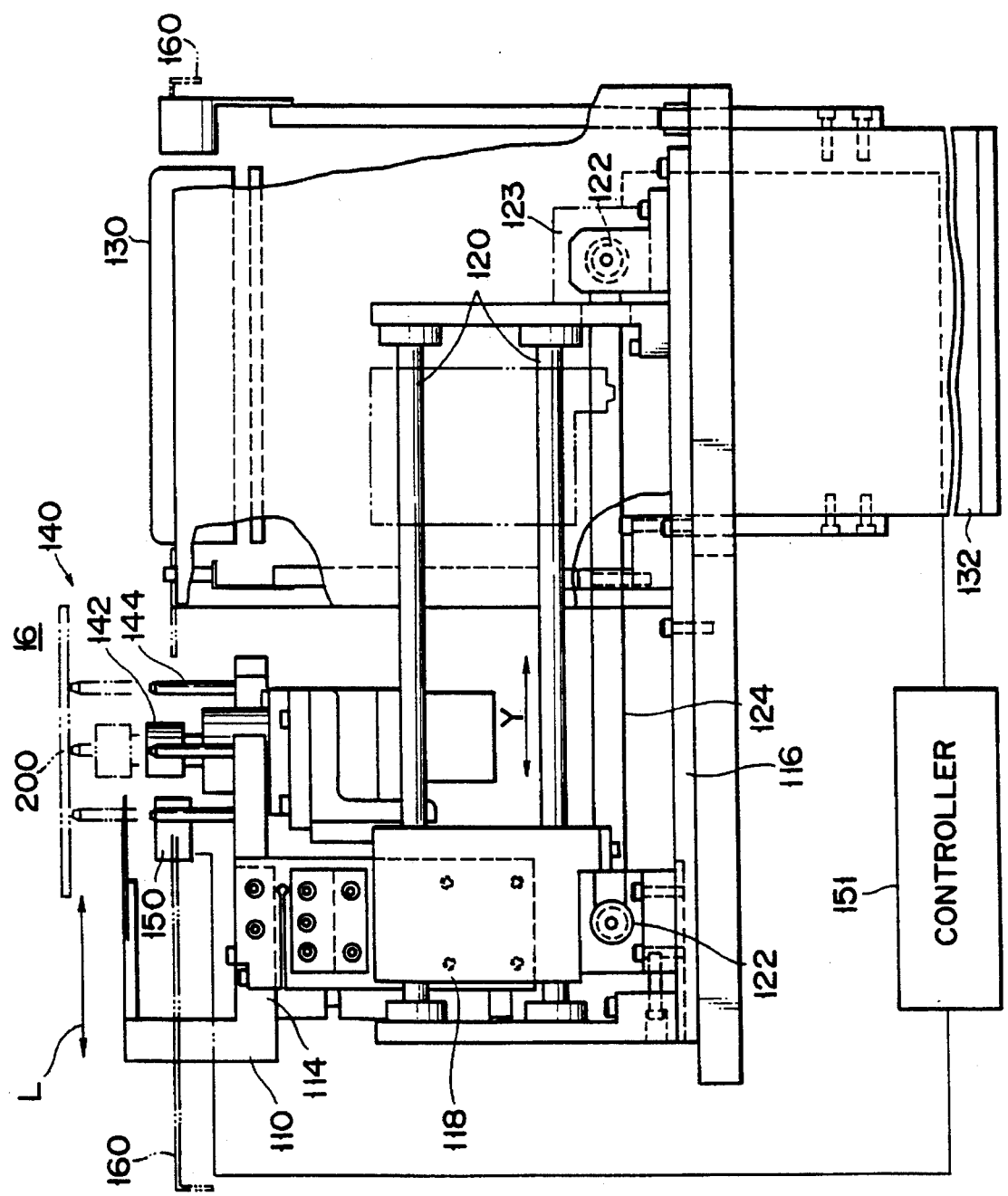

As shown in FIG. 10, the sender 16 is disposed in the outer atmosphere and comprises a transportation arm 110, a cassette stage 130, a pre-alignment stage 140 and an arm deformation sensing unit 150. The transportation arm 110 of the sender 16 takes out a semiconductor wafer from a cassette (not shown) fixedly mounted on the cassette stage 130. After having been set and prealigned on the pre-alignment stage 140, the wafer is transported into the load lock chamber by means of the transportation arm 110 at the side of the load lock chamber.

Figure 11:
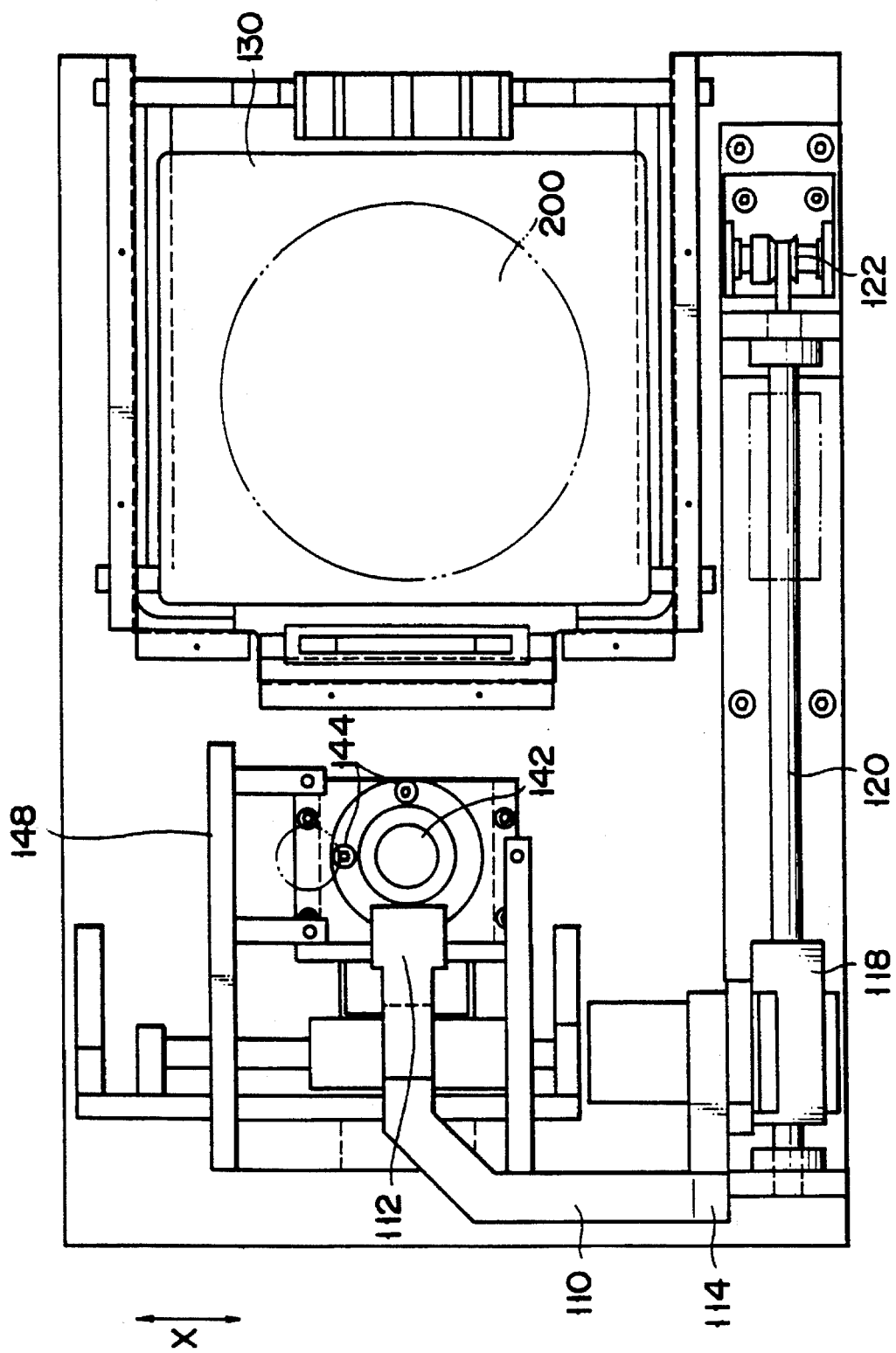

As shown in FIG. 11, the transportation arm 110 assumes an L-shape, and a fixing portion 114 which is one end portion of the transportation arm 110 is fixed to a movable block 118 described later and constituting a drive side, and a free end portion which is the other end portion of the transportation arm 110 is provided with a vacuum type suction portion 112. A horizontal drive mechanism of the transportation arm 110 comprises two guide shafts 120 arranged in parallel with each other on a base 116 and a movable block 118 guided in the horizontal directions by means of the two guide shafts 120. To the movable block 118 is fixed the fixing portion 114 of the transportation arm 110. A pair of pulleys 122 are rotatably provided on the base 116 at two portions spaced apart from each other under the movable block 118. One of the pulleys 122 is mounted on the shaft of a motor 123. A belt 124 is wound around the two pulleys 122 in a stretched manner and one portion of the belt 124 is fixed to the movable block 118. As one of the pulleys 122 is rotated by means of the motor 123, the belt 124 is horizontally moved, and the transportation arm 110 is run via the movable block 118 in the horizontal direction as shown by an arrow Y shown in FIG. 10.

A cassette (not shown) in which a plurality of wafers are immovably mounted is movable up and down in accordance with the movement of the vertical drive mechanism 132 provided under the cassette stage 130. The cassette supports wafers in such a manner that they are laid horizontally and arranged at predetermined vertical intervals. Any wafer can be taken out of the cassette by moving the cassette vertically to the required position and inserting the vacuum type suction portion 112 of the transportation arm 110 into the cassette so as to be disposed under the wafer to be taken out.

The pre-alignment stage 140 is provided at its central portion with a suction-rotation portion 142 for sucking a wafer 200 under vacuum and rotating the same. The suction-rotation portion 142 is vertically movable so as to support the wafer 200. Around the suction-rotation portion 142 are arranged a plurality of (three, for example) lifter pins 144 which are movable vertically independently of the suction-rotation portion 142. As shown in FIG. 14, the front portion of each lifter pin 144 which abuts against the rear surface of the wafer 200 is fixed by a noiseless tip 146 made of non-metallic material such as polytetrafluoroethylene known as Teflon (a trademark). A sensor arm 148 is disposed adjacent the suction-rotation portion 142 so as to be movable in the directions shown by an arrow X in FIG. 11. The wafer 200 is loaded on the suction-rotation portion 142. Thereafter, the wafer 200 is prealigned by means of a sensor (not shown), as the wafer 200 is rotated.

Under the vacuum type suction portion 112 of the transportation arm 110 disposed in the vicinity of the pre-alignment stage 140 is provided an arm deformation sensing unit 150 which is connected through leads to a controller 151 connected to the motor 123 for driving the transportation arm through leads. As shown in FIG. 13A, the arm deformation sensing unit 150 has a first sensor 152 and a second sensor 154 disposed at two portions spaced apart in the lengthwise direction of the vacuum type suction portion 112. The first and second sensors 152 and 154 include photoelectric switches of small-spot limiting reflection type. Each photoelectric switch is turned off in response to infrared rays emitted from a infrared photo-diode and having an aperture of 0.8 mm only when the rays are reflected on the detecting area which is separated by a distance of about 10 mm from the infrared ray exit surface, and the switch is turned on when the emitted rays falls in the outside range of the detecting area.

The arm deformation sensing unit 150 according to this invention comprises two photoelectric switches which are separated by different distances from the transportation arm 110. Their detecting areas partially overlap with each other. As shown in FIG. 13C, the detecting area of the first sensor remoter from the transportation arm is $S_1$min to $S_1$max, and the detecting area of the second sensor closer to the transportation arm is $S_2$min to $S_2$max. Referring to FIG. 13B, it is assumed that the upper limit (the highest position) and the lower limit (the lowest position) of the allowed height region is taken to be $L_1$ and $L_2$, respectively, and $S_1$max of the first sensor and $S_2$min are made equal to $L_1$ and $L_2$, respectively. The first sensor is turned on when the rays are reflected in the range outside of the range between $L_1$ and $S_1$min and the second sensor is turned on when the rays are reflected in the range outside of the range between $L_2$ and $S_2$max. Therefore, when either one of the first and second sensors is turned on, the rays are reflected in the range outside of the range between $L_1$ and $L_2$. This occurs when the transportation arm is deformed. The outputs of the first and second sensors are input to the CPU (not shown) of the controller 151. Where either sensor is turned on, the operation of the plasma processing apparatus including the motor 123 is stopped by the controller 151. By changing the switches of the first and second sensors 152 and 154 with each other, the plasma processing apparatus may be designed to be stopped when either switch is turned off.

Substantially whole the area of the sender is covered with a cover 160 which is cut away at the portion through which the cassette (not shown) loaded on the cassette stage 130 passes and at the portion in which that part of the transportation arm 110 which crosses the cover 160 moves. A meshed surface extends over the whole area of the cover 160 such that down-flow air is introduced from a clean room onto the sender. As shown in FIG. 12, the cover 160 is removably mounted on the upper portion of a side panel 162 by means of a cover fixing portion 164 extending substantially horizontally therefrom. On the fixing surface of the cover fixing portion 164 is formed a rubber magnet, for example, for attracting and holding the metallic portion of the cover 160 such that the fixing surface of the cover faces the cover fixing portion 164.

The operation of the sender 16 will now be explained.

First, a wafer 200 is taken out of the cassette by means of the sender 16 in the following process. The cassette stage 130 is vertically moved to set the wafer to be taken out to a level higher than the horizontal plane on which the transportation arm 110 is moved. The movable block 118 is moved horizontally along the guide shafts 120 by rotating one of the pulleys 122 by means of the motor 123 so as to move the transportation arm 110 integrally fixed to the movable block 118 in rightward direction in FIG. 10. When the vacuum type suction portion 112 of the transportation arm 110 arrives at a portion, in the cassette, under the wafer 200 to be taken out, the horizontal movement of the movable block 118 is stopped. The cassette stage 130 is moved downward such that a wafer 200 is loaded on the vacuum type suction portion 112. Air is evacuated from the vacuum type suction portion 112, whereby the portion 112 sucks and holds the wafer 200.

The wafer 200 is transported from the cassette by moving the transportation arm 110 in the leftward direction in FIG. 10. The movement of the transportation arm 110 is stopped when the wafer 200 arrives at a position over the suction-rotation portion 142 of the pre-alignment stage 140.

At the pre-alignment stage 140, the vacuum type suction portion 112 is made in an inoperative state and the three lifter pins 144 are raised beyond the supporting position of the wafer 200 loaded on the vacuum type suction portion 112 until they reach the position as shown by two-dot chain line in FIG. 10 at which they support the wafer 200. The wafer 200 is loaded on the vacuum type suction portion 142 by elevating the suction-rotation portion 142 or lowering the lifter pins 144 after the transportation arm 110 has been retracted, and then the suction-rotation portion 142 is operated to suck and hold the wafer 200. The sensor arm 148 is moved in the X direction in FIG. 11 and the suction-rotation portion 142 is rotated to perform the pre-alignment of the wafer 200.

The sensor arm 148 is retracted and the upward movement of the lifter pins 144 causes the wafer 200 which has been loaded on the suction-rotation portion 142 to be supported on the lifter pins 144. As shown by two-dot chain lines in FIG. 10, the wafer supporting position is set to a position over a wafer transportation line L. The transportation arm at the side of load lock chamber is moved toward the sender along the wafer transportation line L until the arm reaches the position under the wafer 200. The wafer 200 is sent to the transportation arm at the side of the load lock chamber by moving the lifter pins 144 downward. Thereafter, the wafer 200 is transported toward the process chamber by means of the transportation arm at the side of the load lock chamber.

The transportation arm 110 for transporting a wafer has a fixing portion 114 constituting an end portion at the driving side and a free end portion at the side of the vacuum type suction portion 112. The arm 100 is fixed only at the fixed portion 144. When an operator touches the transportation arm 110 during maintenance operation, for example, the transportation arm 110 is likely to be deformed easily.

In this embodiment, the deformation of the transportation arm 110 is detected by the arm deformation sensing unit 150. The operation of the plasma processing apparatus including the motor 123 for driving the transportation arm is stopped when the deformation exceeds the allowed value. In other words, the first and second sensors 152 and 154 are operated when the vacuum type suction portion 112 of the transportation arm 110 is stopped over the arm deformation sensing unit 150. Small spot infra-red rays are emitted from the infrared photo-diode of the first sensor 152, and the transportation arm 110 detects whether the rays pass the range within the upper limit $L_1$ as shown in FIG. 13B. The first sensor is turned on when the transportation arm 110 is moved beyond the upper limit $L_1$. Simultaneously, the second sensor 154 is operated to check whether the transportation arm 110 is present at the position within the lower limit $L_2$ and is turned on when the arm 110 is disposed in this range. The CPU in the controller 151 in which the signals input from the first and second sensors 152 and 154 judges that the deformation of the transportation arm 110 exceeds the allowable value when at least one of the sensors is turned on. In this case, the CPU stops all parts of the sender including the motor 123.

The deformation of the transportation arm 110 may be checked only when the operation of the arm 110 is initiated after, for example, the maintenance operation has been completed or every time the transportation arm 110 is stopped over the arm deformation sensing unit 150.

In this embodiment, the deformation of the transportation arm 110 can be detected by means of the arm deformation sensing unit 150 before the arm 110 is inserted into the cassette. Since the apparatus is stopped when the deformation of the arm 110 exceeds the allowed value, various trouble due to the deformation of the transportation arm 110, such as collision of the arm against wafers, can be avoided in advance.

If the lifter pins 144 are made of only metal, noise is produced every time the pins 144 contact the rear surface of the wafers and is sent out to the outer atmosphere, because the sender is exposed thereto. However, each lifter pin 144 according to this embodiment is provided with a noiseless tip 146 made of non-metallic material such as polytetrafluoroethylene known as Teflon. Therefore, noise offensive to the ears is securely much reduced in this embodiment.

Since, in the conventional apparatus, the cover is fixed to a sender by means of a screw, the screw must be removed and then attached to the cover every time maintenance of the apparatus is performed. This work is very cumbersome and produces dust which is one of the factors for lowering the efficiency of processing wafers. To the contrary, in this embodiment, the attachment and the detachment of the cover 160 which covers the most part of the upper surface of the sender can easily be established by making the cover 160 contacted with and disconnected from the cover fixing portion 164 formed at the upper portion of the side panel 162 with the rubber magnet, respectively, and the generation of dust is reduced.

The arm deformation sensing unit 150 is not limited to a reflecting type optical sensing unit of the above-mentioned embodiment, but may be a sensing unit which optically detects at least the distance between the transportation arm 110 and a datum transportation plane separated by a predetermined distance from the transportation arm 110. For example, a transparent type optical sensor as shown in FIG. 13 can be used. Optical sensors of reflecting type may be provided at three positions in order to check the flatness of the transportation arm 10.

The transportation arm is used not only to operate the sender, the receiver and the like under the normal pressure but also to operate devices for transporting articles to be transported under a negative pressure.

This invention is not limited to the above-mentioned embodiments but is applicable to various modifications so far as they fall in the scope of this invention.

What is claimed is:

1. A plasma processing apparatus comprising:

a process chamber defined by an inner face of a peripheral wall, said wall having a circular cross section, for receiving therein an article to be processed;

transporting means comprising a door forming part of said peripheral wall, for enabling said article to be transported in and out of said process chamber, said transporting means having an inner surface continuous with the inner face of said peripheral wall and curved substantially at the same radius of curvature as the inner face of said peripheral wall, to avoid plasma discharge;

plasma generating means for forming an electric field and generating plasma and including means for generating a horizontal magnetic field above and in parallel to said article, for circulating said plasma along said wall in said process chamber and in parallel with a process surface of said article to be processed; and wherein, said peripheral wall and transporting means form a continuous cylinder in an area where the plasma contacts said wall and transporting means during etching and an energy of the plasma is not depleted by incongruities in said wall.

2. The plasma processing apparatus according to claim 1, wherein said transporting means includes at least one passage having a first end opened at the peripheral wall of the process chamber and a second open end, a first gate curved for constituting said part of the peripheral wall, the first gate movable to selectively close and open the first end of the passage, and a second gate for selectively closing and opening the second end of the passage.

3. The plasma processing apparatus according to claim 2, wherein said first gate is vertically movable and the second gate has an O-ring for sealing the passage.

4. A plasma processing apparatus comprising:

a process chamber defined by an inner face of a peripheral wall having a circular cross section, for receiving therein an article to be processed;

transporting means forming part of said peripheral wall, for sending said article to be processed in and out of said process chamber, said transporting means having an inner surface continuous with the inner face of said peripheral wall and curved substantially at the same radius of curvature as the inner face of said peripheral wall;

plasma generating means for forming electric field and generating plasma in said process chamber; and arm type transporting means having a cantilevered transportation arm for supporting, at a free end thereof, said article to be processed, and detecting means for optically detecting a distance between said transmission arm and a datum position parallel with a transporting path of said transportation arm.

5. The plasma processing apparatus according to claim 4, wherein said detecting means has a first sensor which is operated when said distance exceeds an upper limit, and a second sensor which is operated when said distance is smaller than a lower limit.

6. The plasma processing apparatus according to claim 4, wherein said detecting means has reflecting type optical sensors.

* * * * *